United States Patent [19]

Dedic et al.

[11] Patent Number: 4,994,805
[45] Date of Patent: Feb. 19, 1991

[54] DELTA SIGMA MODULATOR ARRANGEMENTS COMPENSATED BY CHOPPER STABILIZATION

[75] Inventors: Ian J. Dedic; Alexander W. Vogt, both of London, England

[73] Assignee: The General Electric Company, p.l.c., England

[21] Appl. No.: 389,369

[22] Filed: Aug. 3, 1989

[30] Foreign Application Priority Data

Aug. 5, 1988 [GB] United Kingdom ............... 8818703

[51] Int. Cl.$^5$ .......................................... H03M 3/02
[52] U.S. Cl. .................................. 341/143; 375/29; 375/34
[58] Field of Search ............... 341/143, 172; 375/27, 375/29, 33, 34

[56] References Cited

U.S. PATENT DOCUMENTS

| 4,588,981 | 5/1986 | Senn | 341/143 |
|---|---|---|---|
| 4,600,901 | 7/1986 | Rabaey | 341/143 |
| 4,622,536 | 11/1986 | Shih et al. | 341/172 |
| 4,633,223 | 12/1986 | Senderowicz | 341/172 |

Primary Examiner—William M. Shoop, Jr.
Assistant Examiner—H. L. Williams
Attorney, Agent, or Firm—Kirschstein, Ottinger, Israel & Schiffmiller

[57] ABSTRACT

A delta sigma modulator arrangement in which non-ideal characteristics such as noise or offsets in amplifiers or other circuits of the circuits of the arrangement are compensated by chopper stabilisation.

2 Claims, 2 Drawing Sheets

DELTA SIGMA MODULATOR ARRANGEMENTS COMPENSATED BY CHOPPER STABILIZATION

BACKGROUND OF THE INVENTION

1. Field of the Invention

The present invention relates to delta sigma modulator arrangements.

2. Description of Related Art

The performance of delta sigma modulator arrangements, in particular in respect of the signal to noise ratio and the equivalent resolution obtainable, tends to be limited by non-ideal characteristics of component circuits of the arrangement, such as noise and offsets in integrator circuits. The main component of an integrator circuit is commonly an operational amplifier, and although by careful design the noise and offsets in such amplifiers can be reduced they cannot be eliminated.

SUMMARY OF THE INVENTION

According to one aspect of the present invention in a delta-sigma modulator arrangement non-ideal charateristics such as noise or offset in one or more component circuits of the modulator arrangement are compensated by chopper stabilisation of said one or more component circuits.

Said chopper stabilisation may be effected by periodically inverting signals at the input and output of each of said one or more component circuits.

According to another aspect of the invention in a delta sigma modulator arrangement including one or more component circuits which may introduce noise or offsets into signals passing through said modulator arrangement, there are provided means to transpose up in frequency signal components appearing at a first point at least in said modulator arrangement and means correspondingly to transpose down in frequency signal components appearing at a second point in said modulator arrangement such that noise or offsets introduced between said first point and said second point are effectively transposed to a frequency band at which they can be filtered out of the signal components being modulated.

According to another aspect of the present invention in a delta sigma modulator arrangement in which an integrator circuit comprises an amplifier having differential inputs, differential outputs and respective capacitor means each arranged to be connected between an output and an input, switch means are provided effectively periodically to interchange said capacitor means.

BRIEF DESCRIPTION OF THE DRAWINGS

Delta sigma modulator arrangements in accordance with the present invention will now be described with reference to the accompanying drawings, of which.

DETAILED DESCRIPTION OF THE PREFERRED EMBODIMENTS

Figure 1:
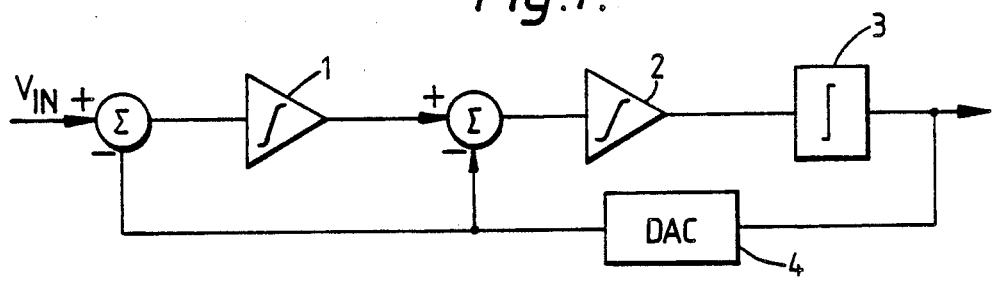
FIG. 1 shows schematically the basic structure of a second order delta sigma modulator arrangement.

Referring first to FIG. 1 in a second-order or double-integration delta sigma modulator arrangement the difference between a fed-back signal and an input signal Vin is integrated in an integrator circuit 1, and the difference between the output of the circuit 1 and the fed-back signal is integrated in an integrator circuit 2. The output of the integrator circuit 2 is "sliced", or compared with a reference signal, in a circuit 3 to provide a "modulated" output signal having one or other of two values in dependence upon whether or not the output of the integrator circuit 2 exceeds the reference signal value. The modulated output signal, which may be treated as a sequence of logic ones and zeros, is used in a circuit 4 to determine the analogue value of the fed-back signal.

A modulator arrangement as shown schematically in FIG. 1 may be realised either with single-ended or differential integrator circuits, and with continuous-time or switched-capacitor differencing circuits. However, in any such realisation noise or offsets in the amplifiers incorporated in the integrator circuits 1 and 2 will affect the signal to noise ratio and resolution of the arrangement.

Figure 2:
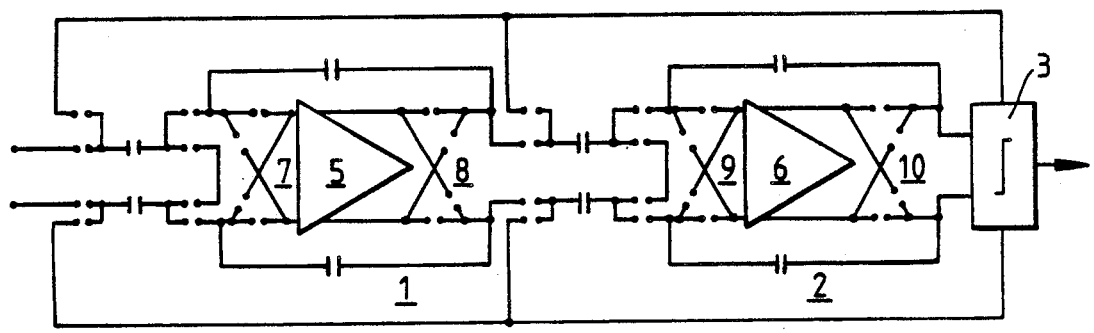
FIG. 2 and 3 show schematically different representations of one form of delta sigma modulator arrangement in accordance with the present invention.

As shown in FIG. 2, which shows the basic structure of a fully differential switched-capacitor modulator arrangement, the amplifiers 5 and 6 utilised in the integrator circuits are "chopper-stabilised", so that low-frequency noise and offsets at the inputs of these amplifiers are translated to a higher frequency band centred on the chopper frequency, where they may be filtered out. The chopper stabilisation may be effected either by mixing the input signal to each amplifier 5 or 6 with a high frequency signal and recovering the required output signal by a second mixing with the same high frequency signal at the output of the amplifier 5 or 6 or, as shown in FIG. 2, the differential inputs and outputs of the amplifiers 5 and 6 may simply be interchanged by means of changeover switches 7 and 8, 9 and 10. These changeover switches may be timed by the clock signals which are utilised in the slicer or comparator 3 to time the modulated output signals.

Figure 3:
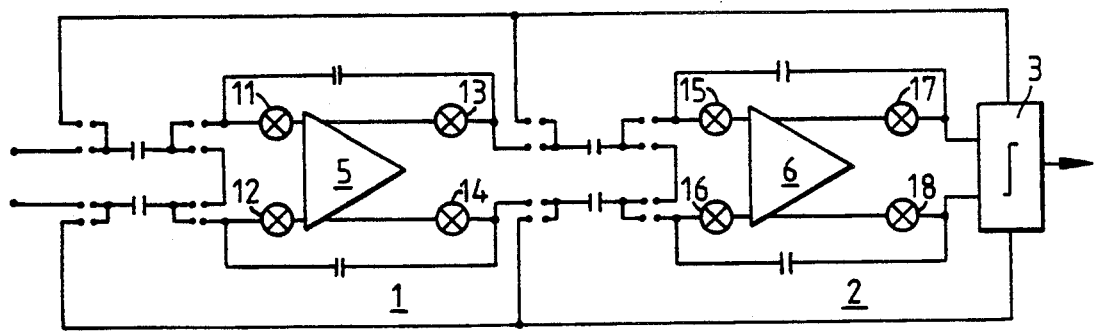
Figure 4:
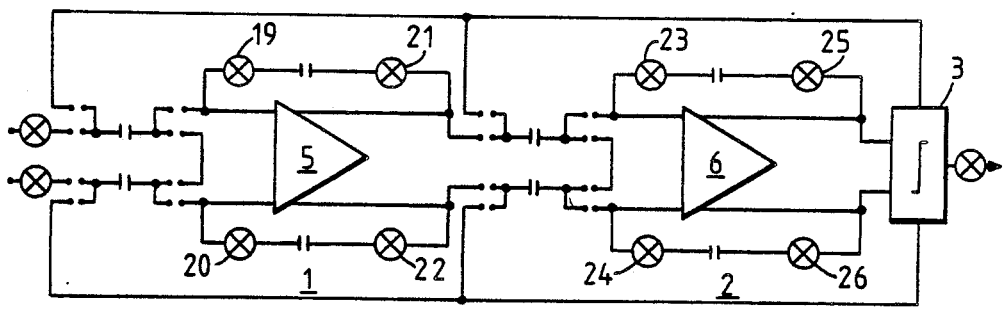
FIGS. 4 and 5 show schematically different representations of a second form of modulator arrangement.

The amplifiers 5 and 6 are not the only sources of low frequency noise or offset, and in theory each component producing these non-ideal effects could be bracketed by chopper switches. However, in the present form of delta sigma modulator arrangement the virtual elimination of such noise and offsets from other components can be achieved without having to use chopper switches for each other component. Referring to FIG. 3, which represents a modulator arrangement of basically the same form as that of FIG. 2, the changeover switches 7 to 10 are represented by individual modulating (or multiplying by plus or minus one) circuits 11 to 18 in each of the signal paths concerned. By arbitrarily placing further such modulating circuits around junctions and analogue switches it can be seen that with proper attraction to clock phasing such circuits may be transferred to different parts of the modulator arrangement, one of the resulting configurations being shown in FIG. 4. In this latter case all elements of the modulator arrangement are covered and all input-referred noise and offsets will be affected by chopper stabilisation.

Figure 5:
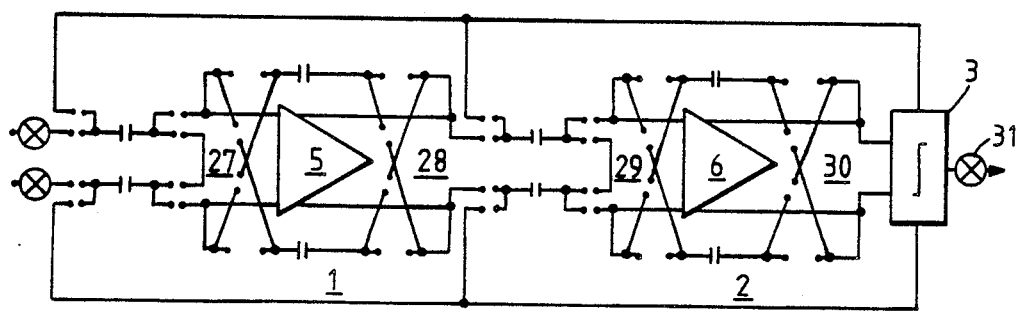

To allow the chopper switches to be transferred in this way two-level feedback signals, of plus and minus and minus V ref, must be utilised. FIG. 5 shows a form of the arrangement of FIG. 4 in which modulating circuits 19 to 26 are replaced by changeover switches 27 to 30. The last modulating circuit or chopper switch 31 in this form of modulator arrangement would be different to the others in that it would simply be required to invert data-type signals at the chopper rate.

We claim:

1. A delta sigma modulator arrangement of the type including at least one component circuit in which noise or offset voltages may arise and which has a pair of input paths, a pair of input terminals, a pair of output terminals and a pair of output paths, said arrangement comprising: first changeover switch means operable periodically for connecting said pair of input paths at input connections to said pair of input terminals and for interchanging said input connections; and second changeover switch means operable periodically in step with said first changeover switch means for connecting said pair of output terminals at output connections to said pair of output paths and for interchanging said output connections.

2. A delta sigma modulator arrangement in accordance with claim 1, wherein said at least one component circuit comprises an integrator circuit having differential inputs and differential outputs.

* * * * *